(12) United States Patent
Toh et al.

(10) Patent No.: US 8,030,760 B2
(45) Date of Patent: Oct. 4, 2011

(54) SEMICONDUCTOR APPARATUS AND MANUFACTURING METHOD THEREOF

(75) Inventors: Keiji Toh, Kariya (JP); Hidehito Kubo, Kariya (JP); Masahiko Kimbara, Okazaki (JP); Haruo Takagi, Kariya (JP); Daizo Kamiyama, Kariya (JP)

(73) Assignee: Kabushiki Kaisha Toyota Jidoshokki, Aichi-ken (JP)

( * ) Notice: Subject to any disclaimer, the term of this patent is extended or adjusted under 35 U.S.C. 154(b) by 137 days.

(21) Appl. No.: 11/999,387

(22) Filed: Dec. 4, 2007

(65) Prior Publication Data
US 2008/0128896 A1    Jun. 5, 2008

(30) Foreign Application Priority Data

Dec. 5, 2006  (JP) ................................. 2006-328396
May 21, 2007  (JP) ................................. 2007-134291

(51) Int. Cl.
*H01L 23/34* (2006.01)
*H01L 21/58* (2006.01)

(52) U.S. Cl. . 257/712; 257/686; 257/706; 257/E23.101; 257/E21.505; 438/122

(58) Field of Classification Search .................. 257/706, 257/712, 718, E23.101, E21.505, 686; 438/122
See application file for complete search history.

(56) References Cited

U.S. PATENT DOCUMENTS

| 6,310,775 | B1* | 10/2001 | Nagatomo et al. | 361/719 |
| 7,217,997 | B2* | 5/2007 | Wyland | 257/707 |
| 2002/0088797 | A1* | 7/2002 | Ramaswamy et al. | 219/634 |
| 2003/0116836 | A1* | 6/2003 | Huang et al. | 257/678 |
| 2004/0037044 | A1* | 2/2004 | Cook et al. | 361/719 |
| 2007/0080471 | A1* | 4/2007 | Yazawa | 257/783 |

FOREIGN PATENT DOCUMENTS

| JP | 5-13660 | 2/1993 |
| JP | 2000-323630 | 11/2000 |
| JP | 2002-270765 | 9/2002 |

* cited by examiner

*Primary Examiner* — Ngan Ngo
*Assistant Examiner* — Benjamin Tzu-Hung Liu
(74) *Attorney, Agent, or Firm* — Locke Lord Bissell & Liddell LLP

(57) ABSTRACT

A semiconductor apparatus includes a semiconductor device, a cooler of a forced cooling type, and a heat mass. Heat generated in the semiconductor device is conducted to the cooler. The heat mass comes into junction with the semiconductor device with solder so as to be thermally combined with the semiconductor device. The heat mass functions also as an electrode.

18 Claims, 7 Drawing Sheets

A⋯THICKNESS   6mm
B⋯THICKNESS  12mm

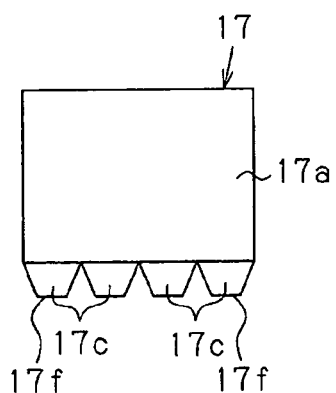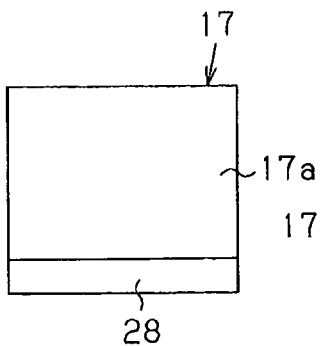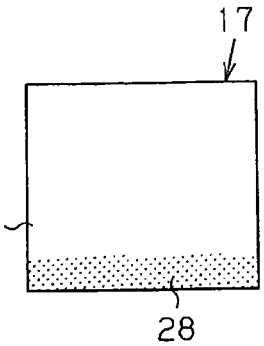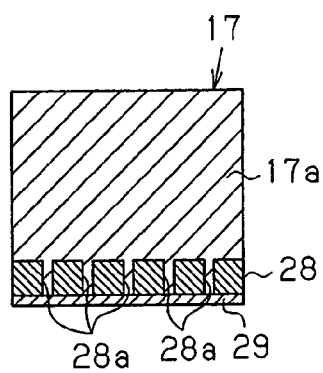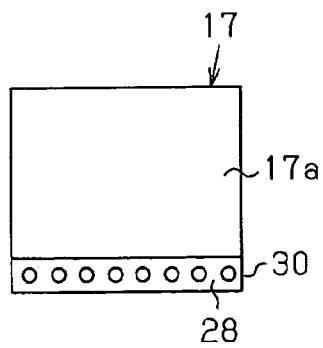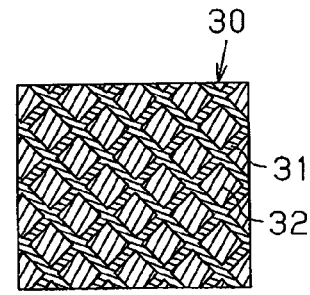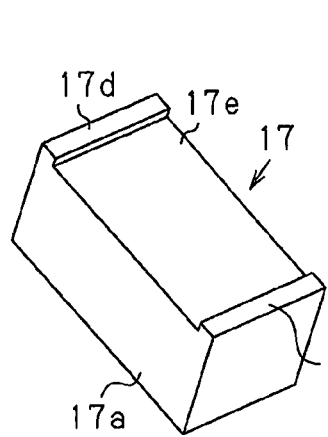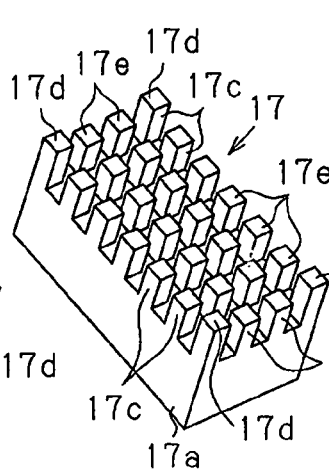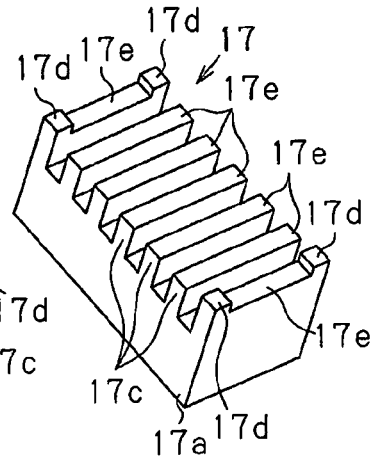

SEMICONDUCTOR APPARATUS AND MANUFACTURING METHOD THEREOF

BACKGROUND OF THE INVENTION

The present invention relates to a semiconductor apparatus and a manufacturing method thereof and relates, in particular, to a semiconductor apparatus including a semiconductor device brought into junction with a circuit substrate comprising a heat sink and a manufacturing method thereof.

A semiconductor apparatus comprising a heat sink, a substrate stacked and adhered to the heat sink, and a semiconductor device mounted on a circuit pattern of the substrate is known. Heat generated by the semiconductor device is conducted to the heat sink through the substrate from the bottom surface of the semiconductor device and, thereby, is dissipated, that is, released. However, when a semiconductor apparatus simply reduces in size, the contact area between the semiconductor device and the substrate reduces. Consequently, a conduction amount, from the bottom surface of the semiconductor device, of heat generated by the semiconductor device reduces. Therefore, the semiconductor device is not cooled smoothly. Thus, Japanese Laid-Open Patent Publication No. 2000-323630 proposes to mount an auxiliary substrate for heat release in a portion in the surface of a semiconductor on the opposite side from the substrate stacked and adhered to a heat sink. A radiation fin or a water-cooled heat sink is mounted on the auxiliary substrate.

FIG. 13A illustrates a semiconductor module 51 disclosed in Japanese Laid-Open Patent Publication No. 2002-270765. The semiconductor module 51 used in an electric power conversion system is intended to restrain a drastic temperature increase of a semiconductor device 54 in the overload state. The semiconductor device 54 is provided on a metal substrate 52 with an insulating substrate 53 in between. A pair of heat accumulators 55 is provided immediately above and in the vicinity of the semiconductor device 54. The heat accumulator 55 houses substance, for example, low melting point metal, which changes in phase from solid to liquid at a temperature slightly lower than the upper limit temperature at which the semiconductor device 54 can be used. The low melting point metal absorbs heat of the semiconductor device 54 temporarily and thereafter releases heat. Heat generated in the semiconductor device 54 is normally conducted only to a cooler (not shown) through a metal substrate 52. However, in the case where the semiconductor device 54 is in the overload state with which cooling capability of the cooler cannot cope sufficiently, the heat accumulator 55 accumulates the excess heat temporarily and thereafter the heat is conducted to the cooler.

FIG. 13B illustrates a junction apparatus disclosed by Japanese Laid-Open Utility Model Publication No. 5-13660. The junction apparatus is intended for production of a thermoelectric module by including a plurality of thermoelectric devices coming into junction with a substrate with high-frequency induction heating. High-frequency induction heating can bring a ceramic member into junction with a metal member and bring electronic parts into junction with a substrate. A junction apparatus comprises a stand 61, a pressuring jig 63 pressuring the substrate 62, and a high-frequency heating coil 64 provided around the pressuring jig 63. The pressuring jig 63 is a weight having an end surface in contact with the substrate 62. A carbon sheet 65, a thermoelectric device 66 and a substrate 62 are sequentially arranged on the stand 61. When the high-frequency heating coil 64 causes the pressuring jig 63 to undergo induction heating, that is, high-frequency heating in the state where the substrate 62 is being pressurized by the pressuring jig 63, heat generated by the pressuring jig 63 is conducted to the substrate 62, the thermoelectric device 66 is brought into junction with the substrate 62. By arranging solder and brazing filler metal between the substrate 62 and the thermoelectric device 66, the thermoelectric device 66 is soldered or brazed to the substrate 62.

Generally, a semiconductor device includes an electrode on the side opposite from the junction surface with the substrate. However, as described above, an auxiliary substrate is mounted on a semiconductor device of the above described Japanese Laid-Open Patent Publication No. 2000-323630. A radiation fin or a water-cooled heat sink is thermally connected to the auxiliary substrate. Therefore, in order to connect a wire or a lead to an electrode being present on the upper surface of a semiconductor device, a special configuration for preventing the wire or the lead from interfering with the radiation fin or a water-cooled heat sink is required. Consequently, the work for bringing the wire or the lead into junction with an electrode is cumbersome.

Comparing with such a configuration of Japanese Laid-Open Patent Publication No. 2000-323630, the above described cooler (not shown) of the above described Japanese Laid-Open Patent Publication No. 2002-270765 can preferably deal with heat generation of the semiconductor device 54 in the non-overload state, for example, the normal state illustrated in FIG. 13A. Therefore, an increase in size of the cooler is restrained. However, the heat accumulator 55 is required to house substance capable of changing from the solid phase to the liquid phase, that is, low melting point metal. Therefore, due to measures for thermal stress or convenience on fabrication of the heat accumulator 55, space is assumed to take place inside the heat accumulator 55 in the case where the low melting point metal is in the liquid phase. Thus, even if the heat accumulator 55 is used as an electrode, the container of the heat accumulator 55 actually functions as an electrical conduction route to make the current uneven between the center and the periphery of the semiconductor device 54. Therefore, the heat accumulator 55 cannot be used as an electrode. Moreover, the wire or the lead to be connected to an electrode needs to be arranged so as not to interfere with the heat accumulator 55. In addition, in the case of mounting a semiconductor module 51 on a vehicle, if low melting point metal inside the heat accumulator 55 occasionally comes into the solid phase in a biased state when a vehicle is accelerated and decelerated, a vehicle runs around a curve, a vehicle shakes or a vehicle inclines, then the subsequent heat accumulating operation may become nonuniform.

SUMMARY OF THE INVENTION

An objective of the present invention is to provide a semiconductor apparatus capable of restraining a drastic temperature increase of a semiconductor device even if the semiconductor device generates heat larger than a static heating state due to an overload and the like, and making the work for bringing a wire or a lead into electrical junction with an electrode of the semiconductor device not cumbersome. Another objective of the present invention is to provide a method of manufacturing a semiconductor apparatus enabling efficient solder work at the time of manufacturing the semiconductor apparatus.

According to one aspect of the invention, a semiconductor apparatus including following elements is provided. The semiconductor apparatus includes: a semiconductor device; a cooler to which heat generated in the semiconductor device is conducted; and a heat mass that comes into junction with the semiconductor device with solder so as to be thermally combined with the semiconductor device. The cooler is of a forced cooling type. The heat mass functions also as an electrode Further, according to another aspect of the invention, a semiconductor apparatus including a semiconductor device including a first surface and a second surface; a cooler of a forced cooling type; and a heat mass thermally combined with the second surface is provided. The cooler is thermally combined with the first surface. The heat mass functions also as an electrode of the semiconductor device.

Other aspects and advantages of the invention will become apparent from the following description, taken in conjunction with the accompanying drawings, illustrating by way of example the principles of the invention.

BRIEF DESCRIPTION OF THE DRAWINGS

The features of the present invention that are believed to be novel are set forth with particularity in the appended claims. The invention, together with objects and advantages thereof, may best be understood by reference to the following description of the presently preferred embodiments together with the accompanying drawings in which:

FIGS. 9A to 9E are each a front view of a heat mass according to a modified embodiment;

FIG. 9F is a cross-sectional view of metal composite material illustrated in FIG. 9E;

FIGS. 10A to 10C are each a bottom perspective view of a heat mass according to a modified embodiment;

DETAILED DESCRIPTION OF THE PREFERRED EMBODIMENTS

Figure 1:
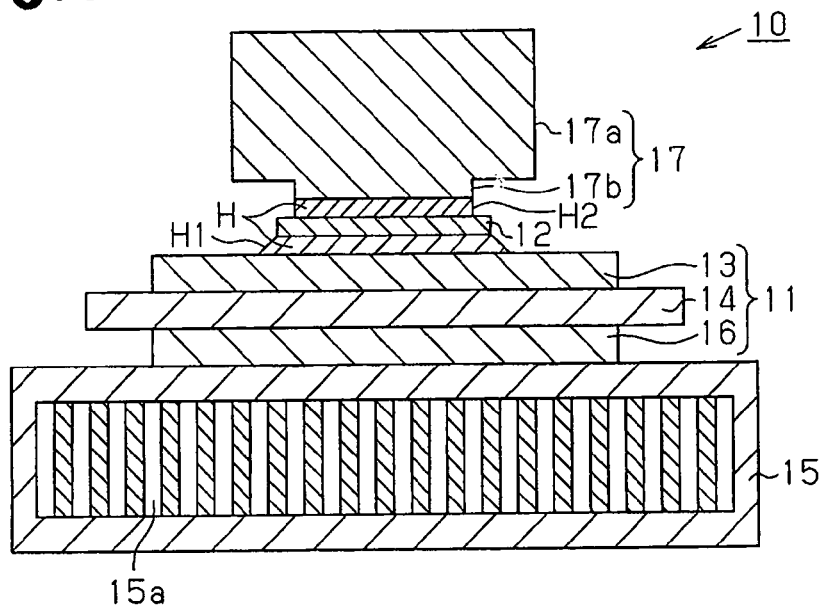
FIG. 1 is a cross-sectional view of a semiconductor apparatus according to a first embodiment of the present invention.
Figure 2:
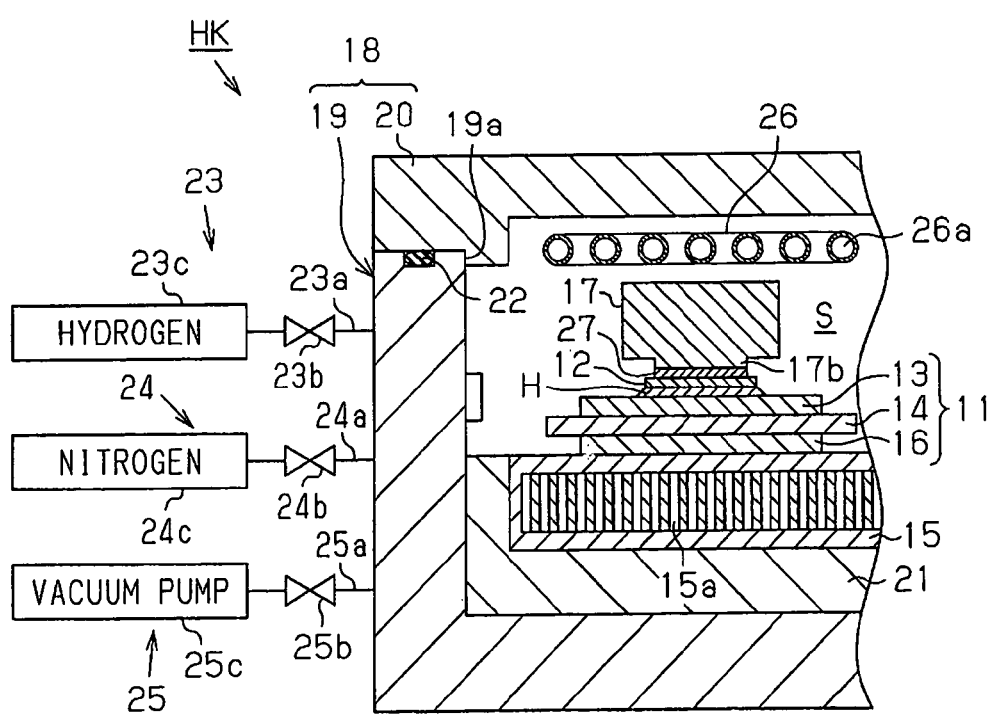
FIG. 2 is a cross-sectional view of a soldering apparatus for manufacturing the semiconductor apparatus in FIG. 1.

FIGS. 1 to 6 illustrate a semiconductor apparatus 10 according to a first embodiment of the present invention. The semiconductor apparatus 10 being a semiconductor module is mounted on a vehicle. FIG. 2 illustrates a soldering apparatus HK for manufacturing the semiconductor apparatus 10. FIGS. 1 and 2 schematically illustrate a configuration of the semiconductor apparatus 10 and the soldering apparatus HK.

For convenience of illustration, in order to exaggerate a part of measurement for user-friendly description, proportion of the semiconductor apparatus 10 to the soldering apparatus HK in measurement of width, length, thickness and the like is different from actual proportion.

As illustrated in FIG. 1, the semiconductor apparatus 10 comprises an insulated circuit substrate 11 as a substrate and a semiconductor device 12 being a semiconductor chip brought into junction with the insulated circuit substrate 11 with solder H. The insulated circuit substrate 11 includes a ceramic substrate 14, a metal circuit 13 formed on the surface of the ceramic substrate 14 and a metal plate 16. The ceramic substrate 14 is brought into junction with a heat sink 15 made of metal with the metal plate 16 in between. Consequently, the insulated circuit substrate 11 is integrated with the heat sink 15. The heat sink 15 is a plate-like cooler comprising refrigerant flow path 15a where a refrigerant flows. The cooling capability of the heat sink 15 is set such that heat generated in the semiconductor device 12 in the static heating state, that is, the normal state is conducted to the heat sink 15 through the insulated circuit substrate 11 so as to be removed smoothly from the semiconductor device.

The heat sink 15 functioning as a cooler of a forced cooling type forcibly cools heat generated in the semiconductor device 12 and conducted to the heat sink 15 through the insulated circuit substrate 11. Unlike natural cooling, that is, simple standing to cool, "cooler of a forced cooling type" means a cooler that performs cooling by supplying energy from the outside to cause the refrigerant to flow. Moreover, "cooler of a forced cooling type" also means a cooler in which refrigerant is boiled and cooled to change to the liquid phase, the gas phase and the liquid phase in this order so that the refrigerant is circulated naturally.

The heat sink 15 is formed of aluminum-based metal, copper and the like. The aluminum-based metal means aluminum or aluminum alloy. The metal plate 16 functions as a junction layer bringing the heat sink 15 in junction with the ceramic substrate 14 and is formed of aluminum and copper, for example. A refrigerant flow path 15a comprises an inlet and an outlet (neither is shown) formed connectable to a refrigerant circulation path mounted on a vehicle. A plurality of insulated circuit substrates 11 and a plurality of semiconductor devices 12 are mounted on the heat sink 15. However, for convenience of illustration, FIG. 1 illustrates only one insulated circuit substrate 11 and one semiconductor device 12.

The semiconductor device 12 is any one of an IGBT (Insulated Gate Bipolar Transistor), a MOSFET and a diode, for example. The metal circuit 13 is made of aluminum or copper, for example. The ceramic substrate 14 is made of aluminum nitride, alumina or silicon nitride.

A heat mass 17 is brought into junction with the semiconductor device 12 with the solder H. The heat mass 17 temporarily absorbs and thereafter releases heat generated in the semiconductor device 12. That is, the heat mass 17 included in the semiconductor apparatus 10 is arranged on the semiconductor device 12 and is brought into junction with the semiconductor device 12 with the solder H. The heat mass 17 can be said to be thermally connected to the semiconductor device 12. A "heat mass" is a member thermally connected to the semiconductor device 12 and means a member having a predetermined heat capacity to accept, that is, absorb the heat of the semiconductor device 12 in the case where the temperature of the semiconductor device 12 becomes higher than that of the relevant member.

Thus, the bottom surface of the semiconductor device 12 is a first surface thermally connected to the heat sink 15. The upper surface of the semiconductor device 12 is a second surface thermally connected to the heat mass 17. Solder bringing the semiconductor device 12 into junction with the insulated circuit substrate 11 will be hereinafter occasionally and referred to as "first solder H1" as necessary and solder bringing the heat mass 17 into junction with the semiconductor device 12 will be hereinafter referred to as "second solder H2".

The heat mass 17 acts as an electrode of the semiconductor device 12. For example, in the case where the semiconductor device 12 is an IGBT, the heat mass 17 positioned on the upper surface of the semiconductor device 12 is an emitter electrode. In the case where the semiconductor device 12 is a MOSFET, the heat mass 17 is a source electrode. In the case where the semiconductor device 12 is a diode, the heat mass 17 is an anode electrode.

That is, the electrode as which the heat mass 17 acts is an electrode for the main current of the semiconductor device 12. The electrode for the main current of the semiconductor device 12 is the source or the drain in the case where the semiconductor device 12 is a MOSFET; is the emitter or the collector in the case where the semiconductor device 12 is an IGBT; and is an anode or a cathode in the case where the semiconductor device 12 is a diode. That is, the "electrode for the main current of the semiconductor device 12" is different from a gate and a base of a transistor and means an electrode other than a controlling electrode. Thus in the case where the electrode as which the heat mass 17 acts is an electrode for the main current of the semiconductor device 12, the controlling electrode of a transistor does not undergo a change in temperature itself even if the change in temperature of the heat mass 17 transitionally gets larger. Therefore, there is no problem.

The heat mass 17 of the present embodiment comprises a body 17a and one foot 17b. The planar shape of the body 17a is larger than the semiconductor device 12. The planar shape of the foot 17b is smaller than the semiconductor device 12.

For example, in the case where the heat sink 15 cannot sufficiently cool the semiconductor device 12 alone due to heat larger than that of the static heating state being generated from the semiconductor device 12 in the overload state, the heat mass 17 temporarily absorbs a part of the heat generated in the semiconductor device 12 and thereby restrains an overheated state of the semiconductor device 12. The heat capacity of the heat mass 17 is set such that the required heat capacity for the absorbing is ensured. For example, in the case where the semiconductor apparatus 10 is an inverter controlling the running motor of a hybrid vehicle, the amount of heat loss is generated as much as three to five times larger than the rated amount by heating from the semiconductor device 12 for a short period less than 1 second when the vehicle is abruptly accelerated or suddenly stopped from a steady operation state. Even in such a case, the heat capacity of the heat mass 17 of the present invention is set such that the temperature of the semiconductor device 12 will not exceed the upper limit of the operation temperature. When a vehicle stops suddenly, a large current is likely to flow in the semiconductor device 12 because the vehicle brake causes the running motor to regenerate the operation. In that case, an excess amount of heat loss is generated from the semiconductor device 12.

Material of the heat mass 17 is preferably metal with a melting point higher than the melting point of the solder H bringing the heat mass 17 into junction with the semiconductor device 12.

Figure 3:
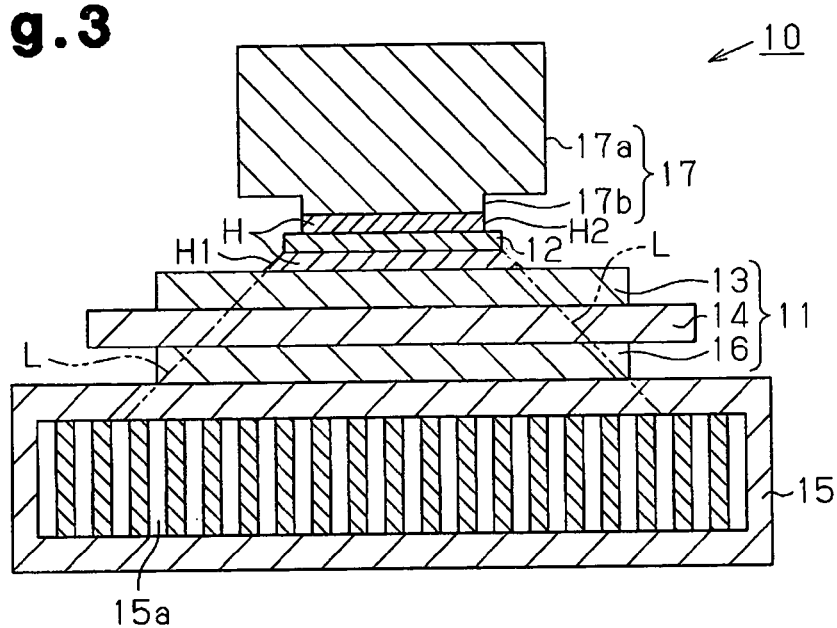
FIG. 3 is a cross-sectional view illustrating a heat conduction route from the semiconductor apparatus to a heat sink illustrated in FIG. 1.

The line L indicated with a two-dot chain line in FIG. 3 represents the boundary of the heat conduction route from the semiconductor device 12 to the heat sink 15. The heat conduction route is shaped in a truncated quadrilateral pyramid. The vertex of the truncated quadrilateral pyramid is positioned on the bottom surface of the semiconductor device 12. Each side surface of the truncated quadrilateral pyramid is an inclined plane at an angle of 45° to the bottom surface of the semiconductor device 12. The heat capacity of the heat mass 17 is set larger than the heat amount of the heat conduction route.

The size of the heat mass 17 in view from above in FIG. 1, that is, in a plane view of the heat mass 17 is preferably equivalent to or larger than the heated site of the semiconductor device 12 and not larger than the size of the semiconductor device 12 in its entirety from the point of view of both arrangement space and heat resistance of the heat mass 17. The thickness of the heat mass 17 may be varied as necessary such that the required heat capacity of the heat mass 17 is ensured by simulations like the simulations described below or actual measurement.

Next, a method of manufacturing the semiconductor apparatus 10 will be described.

A step of soldering the heat mass 17 to the semiconductor device 12 is a step of a method of manufacturing the semiconductor apparatus 10 and a novel step which did not exist conventionally and, therefore, will be described below.

A soldering apparatus HK illustrated in FIG. 2 is usable for manufacturing the semiconductor apparatus 10 and carries out soldering by high-frequency induction heating. The soldering apparatus HK comprises a sealable container 18, that is, a chamber. The container 18 comprises a box body 19 and a lid 20 opening or closing an opening 19a of the box body 19. The box body 19 houses a support stand 21. The support stand 21 positions and supports the heat sink 15. Packing 22 is arranged in a site of the box body 19 on which the lid 20 is mounted.

The lid 20 has a size capable of closing the opening 19a of the box body 19. The box body 19 and the lid 20 defines sealed space S inside the container 18.

As described in FIG. 2, a reducing gas supply section 23, an inert gas supply section 24 and a gas discharging section 25 are connected to the box body 19. The reducing gas supply section 23 supplies reducing gas, for example, hydrogen, to inside the container 18. The inert gas supply section 24 supplies inert gas, for example, nitrogen to inside the container 18. The gas discharging section 25 discharges gas filling the interior of the container 18 to outside. The reducing gas supply section 23 comprises piping 23a, an opening and closing valve 23b and a hydrogen tank 23c. The inert gas supply section 24 comprises piping 24a, an opening and closing valve 24b and a nitrogen tank 24c. The gas discharging section 25 comprises piping 25a, an opening and closing valve 25b and a vacuum pump 25c. That is, the reducing gas supply section 23, the inert gas supply section 24 and the gas discharging section 25 can adjust, that is, increase and decrease pressure of the sealed space S.

Moreover, a cooling heat medium supply part (not shown) being a supply part supplying the interior of the container 18 after soldering with thermal medium such as cooling gas, for example, is connected to the box body 19.

A high-frequency heating coil 26 is arranged inward the box body 19 relative to the lid 20. The high-frequency heating coil 26 of the present embodiment has a size corresponding to a plurality of ceramic substrates 14. The high-frequency heating coil 26 is shaped like a spiral, for example, an angular spiral and is spread out in a planar manner. The high-frequency heating coil 26 is electrically connected to a high-frequency generation apparatus (not shown) which the soldering apparatus HK comprises. The output of the high-frequency generation apparatus is controlled based on a result of measurement of the temperature sensor (not shown) arranged inside the container 18. The high-frequency heating coil 26 has, inside the coil, a cooling path 26a for cooling water to pass. The cooling path 26a is connected to a cooling water tank (not shown) which the soldering apparatus HK comprises.

Next, with the soldering apparatus HK, the step of soldering the heat mass 17 to the semiconductor device 12 will be described.

Prior to the step of soldering the heat mass 17, the step of fabricating the insulated circuit substrate 11 on the heat sink 15 and the step of packaging, that is, soldering the semiconductor device 12 to the insulated circuit substrate 11 are carried out. After the step of packaging the semiconductor device 12, the step of soldering the heat mass 17 is carried out.

In order to solder the heat mass 17, the lid 20 is disengaged from the box body 19 at first and thereby the opening 19a is opened widely. As illustrated in FIG. 2, positioning is carried out by putting the heat sink 15 on the support stand 21 of the box body 19. Next, sheet solder 27 is mounted on the semiconductor device 12 already soldered on the insulated circuit substrate 11. The foot 17b of the heat mass 17 is arranged on the sheet solder 27.

Next, the lid 20 is attached to the box body 19. Thereby the opening 19a is closed and the sealed space S is defined. The high-frequency heating coil 26 is arranged so as to face the heat mass 17.

Next, the gas discharging section 25 is operated to vacuum the interior of the container 18. Thereafter the inert gas supply section 24 is operated to supply the interior of the container 18 with nitrogen. Thereby the sealed space S is filled with the inert gas. The operations of the gas discharging section 25 and the inert gas supply section 24 are repeated several times. Thereafter, the reducing gas supply section 23 is operated to supply the interior of the container 18 with hydrogen. Thereby the sealed space S is replaced by reducing gas atmosphere.

Next, by activating the high-frequency generating apparatus, high-frequency current is caused to flow in the high-frequency heating coil 26. Then high-frequency magnetic flux passing through the heat mass 17 is generated in the high-frequency heating coil 26. An eddy current is generated in the heat mass 17 by the passing magnetic flux, and the heat mass 17 generates heat. Heat generated in the heat mass 17 is conducted to the sheet solder 27 mounted on the semiconductor device 12. Thereby the sheet solder 27 is heated. When the temperature of the sheet solder 27 reaches or exceeds the melting temperature, the sheet solder 27 is melted.

After the sheet solder 27 is melted completely, the high-frequency generation apparatus is caused to stop. The magnitude of the high-frequency current flowing in the high-frequency heating coil 26 is controlled based on the detection result of a temperature sensor (not shown) installed inside the container 18. The pressure of the sealed space S is increased or decreased in synchronization with the progressing state of the solder work as necessary so that the atmosphere is adjusted.

After halting the high-frequency generation apparatus, a cooling heat medium supply part is operated to supply the interior of the container 18 with cooling gas. Then, the cooling gas is blown into the inlet or the outlet the refrigerant flow path 15a of the heat sink 15. The cooling gas supplied to inside the container 18 flows in the refrigerant flow path 15a, moreover, flows around the heat sink 15, thereby cooling the insulated circuit substrate 11 and the heat mass 17. Consequently, the melted solder gets is cooled below the melting temperature to be solidified to bring the heat mass 17 into junction with the semiconductor device 12. Therefore, soldering of the heat mass 17 is finished to complete the semiconductor apparatus 10. After taking out the lid 20 from the box body 19, the semiconductor apparatus 10 is taken out from inside the container 18.

Next, operations of the semiconductor apparatus 10 will be described.

The semiconductor apparatus 10 of the present embodiment is mounted on a hybrid vehicle. The heat sink 15 is structured to communicate with a refrigerant circulation path (not shown) of a vehicle through a pipe. The refrigerant circulation path includes a pump and a radiator. Since the radiator comprises a fan rotated by a cooling motor, the heat release efficiency of the radiator is excellent. The refrigerant is, for example, water.

When the semiconductor device 12 mounted on the semiconductor apparatus 10 is driven, heat is generated from the semiconductor device 12. In the case where a vehicle is in a static operation state, that is, the semiconductor device 12 is in a static heat generation state, heat generated from the semiconductor device 12 is conducted to the heat sink 15 through the solder H and the insulated circuit substrate 11. Heat conducted to the heat sink 15 is conducted to the refrigerant flowing in the refrigerant flow path 15a and taken away by the refrigerant. That is, the refrigerant flowing in the refrigerant flow path 15a cools the heat sink 15 compulsorily. Therefore, temperature gradient in the conduction route of heat from the semiconductor device 12 and the like to the heat sink 15 gets larger to remove the heat generated in the semiconductor device 12 efficiently through the insulated circuit substrate 11.

When a vehicle is abruptly accelerated or suddenly stopped from a steady operation state, heating from the semiconductor device 12 rapidly increases to generate an amount of heat loss as much as three to five times larger than the rated amount for a short period not longer than 1 second. Forced cooling by the heat sink 15 alone cannot deal with such high heating in the non-static state. However, the heat mass 17 is soldered to the semiconductor device 12 of the present embodiment. Therefore, the heat mass 17 temporarily absorbs the heat that the heat sink 15 cannot remove completely. When a vehicle returns to the static operation state, the heat of the heat mass 17 is conducted to the heat sink 15 through the semiconductor device 12 and the insulated circuit substrate 11 and is removed. Therefore, the heat mass 17 returns to the original state.

Figure 4:
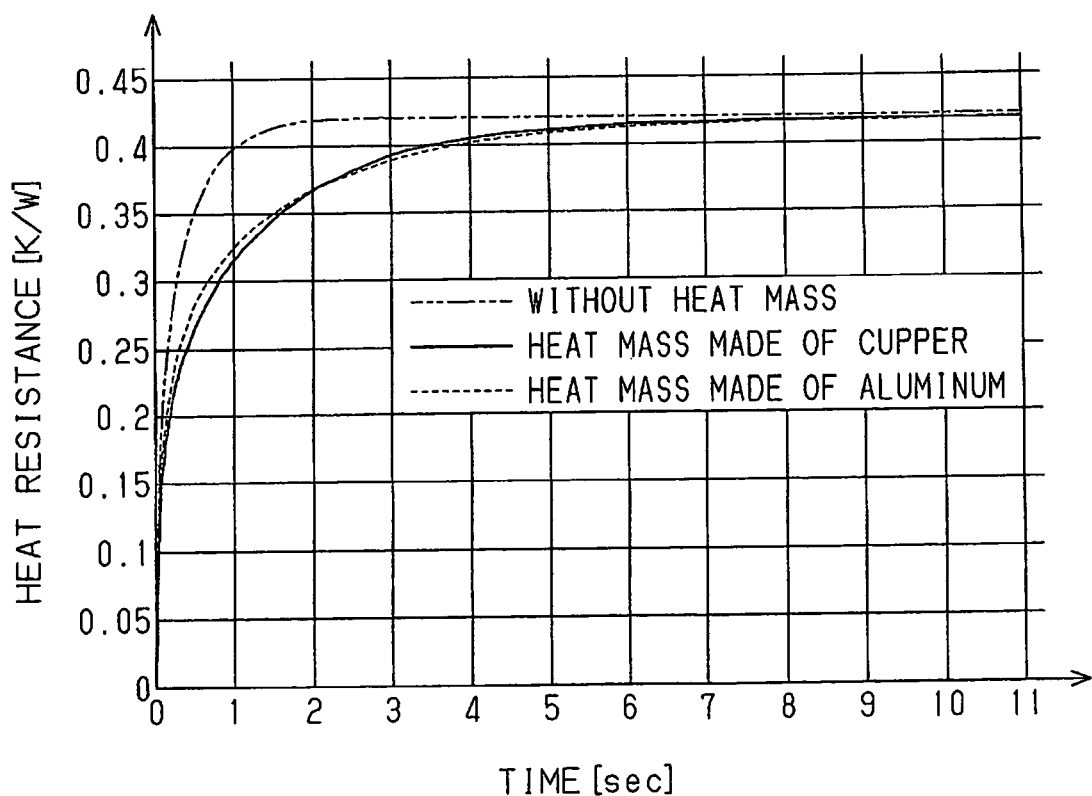
FIG. 4 is a graph of a result of simulating the change in heat resistance of the semiconductor apparatus illustrated in FIG. 1.
Figure 5:
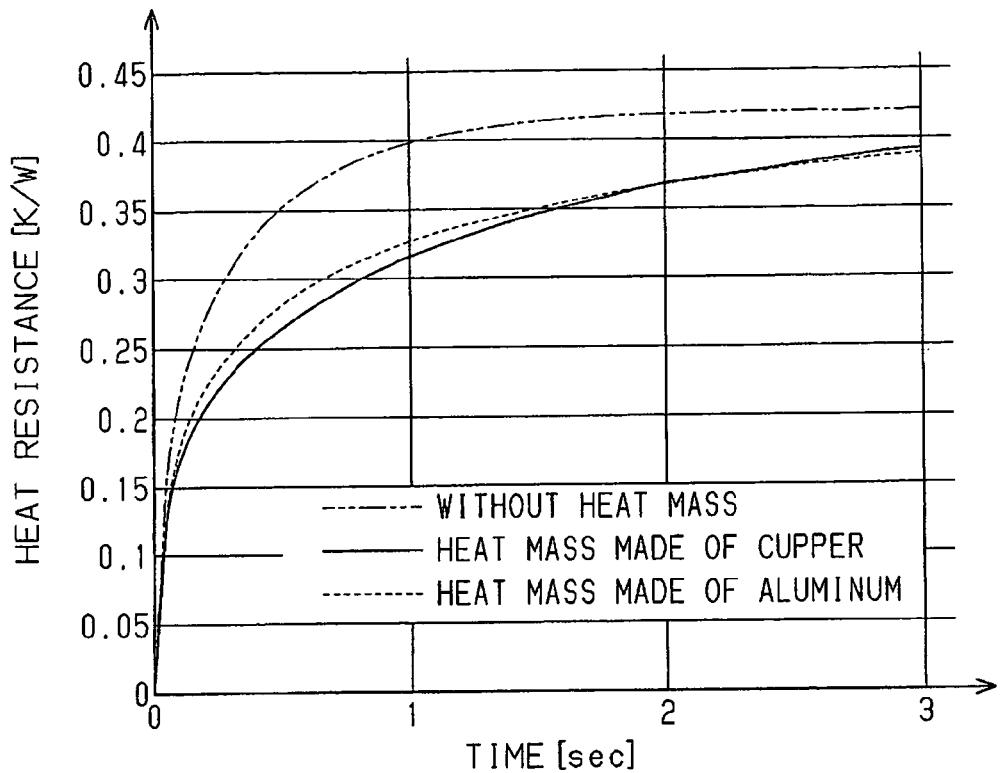
FIG. 5 is a partial enlarged view of FIG. 4.
Figure 6:
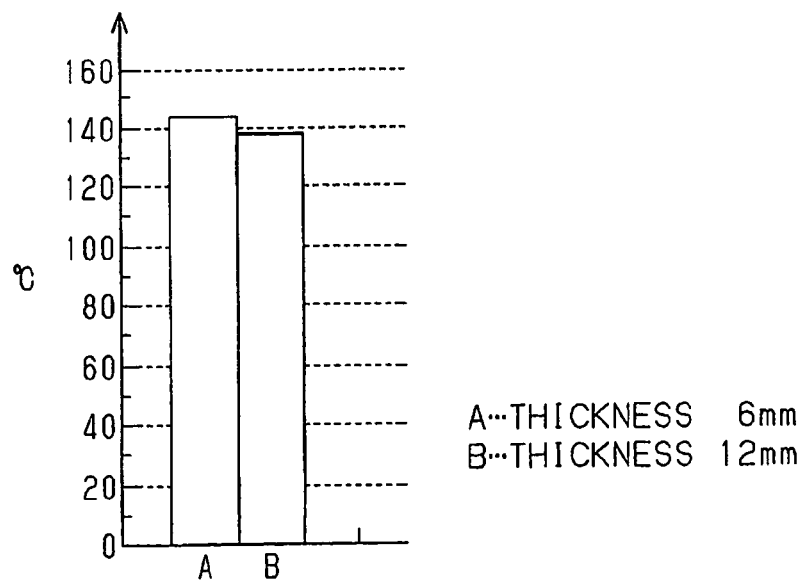
FIG. 6 is a graph illustrating influence of thickness of a heat mass to a temperature increase level of the semiconductor apparatus illustrated in FIG. 1.

FIGS. 4 to 6 illustrate a simulation result of characteristics of the heat mass 17. The temperature of the semiconductor device 12 will be described simply as "device temperature" as necessary below. A "static operation" of the semiconductor device 12 means the state where the semiconductor device 12 generates heat continuously and the heat sink 15 cools the semiconductor device 12. For simulation, a change in heat resistance in view from the semiconductor device 12 and the device temperature in the case where the semiconductor device 12 in the static operation state at device temperature of 65° C., that is, 338.15 kelvins generates the maximum heat are obtained. The "heat resistance in view from the semiconductor device 12" represents the sum of the conductibility from the semiconductor device 12 to the heat sink 15 and the conductibility from the semiconductor device 12 to the heat mass 17. That is, the "heat resistance in view from the semiconductor device 12" represents an index of coolability the semiconductor device 12. When the above described heat resistance decreases, coolability the semiconductor device 12 is improved.

FIG. 4 illustrates a time change in the heat resistance of the semiconductor device 12. FIG. 5 illustrates a partial enlarged view of FIG. 4. The two-dot chain line represents a simulation result in the case where there is no heat mass 17. The dashed line represents a simulation result in the case of using the heat mass 17 made of Al (aluminum). The solid line represents a simulation result in the case of using the heat mass 17 made of Cu (copper). Any one thereof provides the same heat capacity of the heat mass 17. If heat resistance of the semiconductor device 12 falls not larger than a desired value from the maximum heating commencement to a predetermined time, the heat mass 17 can be said to have the required capability. Since Al has a lower heat conductivity than Cu, as apparent from FIGS. 4 and 5, at the beginning, that is, from 0 second to 2 seconds, the level of increase in the heat resistance of Al represented by the dashed line is larger than the level of increase in heat resistance of Cu represented by the solid line. That is, temperature increase of the semiconductor device 12 in the case of the heat mass 17 made of Al is steeper than the temperature increase of the semiconductor device 12 in the case of heat mass 17 made of Cu. However, Cu with excellent heat conductivity approaches thermal saturation faster than Al. Therefore, the solid line for Cu gets higher than the dashed line for Al from midway, that is, approximately after 2 seconds. Therefore, it was evidenced that the heat resistance in view from the semiconductor device 12 can be set to a desired value by selecting the material for the heat mass 17.

FIG. 6 shows device temperature after the lapse of predetermined time or 0.5 seconds, for example, from the occurrence of the transitional state of the semiconductor device 12 where the thickness of the heat mass 17 is 6 mm and 12 mm. The first vertical bar A represents the device temperature in the case of the heat mass 17 with thin thickness, that is, of small heat capacity with thickness of 6 mm. The second vertical bar B represents the device temperature in the case of the heat mass 17 with thickness of 12 mm. As apparent from FIG. 6, difference in thickness of the heat mass 17, that is, difference in heat capacity of the heat mass 17 results in difference in the level of temperature increase of the semiconductor device 12. That is, the device temperature of the first vertical bar A is higher than the device temperature of the second vertical bar B, so the level of the temperature increase of the semiconductor device 12 is large. Therefore, it was evidenced that adjustments in heat capacity enable adjustments in the level of the temperature increase of the semiconductor device 12.

The present embodiment is advantageous as follows.—

(1) The semiconductor apparatus 10 comprises the semiconductor device 12, the heat sink 15 and the heat mass 17. The semiconductor device 12 is provided on the insulated circuit substrate 11. The heat sink 15 is a cooler of a forced cooling type to which heat generated in the semiconductor device 12 is conducted. The heat mass 17 is brought into solder junction with the semiconductor device 12 on the semiconductor device 12 so as to be thermally connected to the semiconductor device 12. The heat mass 17 also functions as an electrode of the semiconductor device 12. Accordingly, the heat mass 17 temporarily absorbs a part of the heat generated in the semiconductor device 12 in the case where heat larger than heat of the static heating state is generated from the semiconductor device 12 in an overload state and the like. Therefore, even if the heat sink 15 is short of the cooling capability, the overheated state of the semiconductor device 12 is restrained.

Moreover, since the heat mass 17 also functions as an electrode of the semiconductor device 12, a wire or a lead is electrically connected to the heat mass 17. Thereby the wire or the lead can be electrically connected to the electrode of the semiconductor device 12. Accordingly, even if the heat mass 17 is in the state where the heat mass 17 is brought into junction with the upper surface of the semiconductor device 12, the work for bringing the wire or the lead into junction with an electrode of the semiconductor device 12 is not cumbersome.

(2) The semiconductor device 12 is provided on the insulated circuit substrate 11 as an insulated substrate. The heat generated in the semiconductor device 12 is conducted to a cooler, that is, the heat sink 15 through the insulated circuit substrate 11. Accordingly, the semiconductor device 12 is brought into junction with the cooler in the electrically insulated state. Therefore, electrical insulation is ensured between the semiconductor device 12 and the refrigerant inside the cooler. Accordingly, electrically conductive liquid, for example, water and LLC (Long Life Coolant) can be used as a refrigerant.

(3) The heat capacity of the heat mass 17 is set so as to be capable of absorbing the heat exceeding cooling performance of the heat sink 15 even if the semiconductor device 12 generates heat larger than in the static heating state in short time. Accordingly, the semiconductor device 12 can be restrained not to come into an overheated state.

(4) The heat mass 17 comprises the body 17a and the foot 17b. The body 17a is soldered on the upper surface of the semiconductor device 12 through the foot 17b. The area of the foot 17b is set smaller than the area of the upper surface of the semiconductor device 12, and the area of the body 17a is set larger than the area of the upper surface of the semiconductor device 12. Accordingly, the heat mass 17 of the present embodiment efficiently absorbs heat generated in the semiconductor device 12 compared with, for example, the case of setting the body 17a and the foot 17b to have the same area.

(5) The material of the heat mass 17 is metal with a melting point higher than the melting point of the solder H bringing the semiconductor device 12 into junction with the heat mass 17. The heat mass 17 functions as an electrode and, therefore, requires electrical conductivity. Most of metals are superior to nonmetal in electrical conductivity and heat conductivity. Therefore the heat mass 17 preferable as an electrode is easily formed with metal. In addition, the heat mass 17 made of metal can be processed easily at the time of formation.

(6) The heat capacity of the heat mass 17 is set larger than the heat capacity of the heat conduction route from the semiconductor device 12 to a cooler, that is, the heat sink 15. In order to restrain a drastic temperature increase of the semiconductor device 12, the heat capacity for absorbing the transitional heat generated by the semiconductor device 12 is required to be thermally connected to the semiconductor device 12. In the present embodiment, the heat capacity of the heat mass 17 is set larger than the heat capacity of the heat conduction route. Thereby, the heat mass 17 can efficiently absorb the transitional heat of the semiconductor device 12 and a configuration with low heat resistance of the static heat conduction route from the semiconductor device 12 to the heat sink 15 can be realized.

(7) The semiconductor apparatus 10 is a semiconductor apparatus mounted on a vehicle. In the case where the semiconductor apparatus 10 is a drive apparatus of a vehicle running motor, due to a change in the vehicle running state, the current flowing in the semiconductor apparatus 10 occasionally temporarily increases rapidly to bring the semiconductor apparatus 10 into a transitional overload state. However, the heat mass 17 of the present embodiment absorbs a part of the heat generated in the semiconductor device 12. Therefore the semiconductor device 12 is restrained from coming into an overheated state.

(8) As a step of a method of manufacturing the semiconductor apparatus 10, at an occasion of soldering the heat mass 17 onto the semiconductor device 12, at first, the heat mass 17 is mounted on the semiconductor device 12 through the sheet solder 27. Then, the heat mass 17 undergoes high-frequency induction heating. Thereby the heat mass 17 is caused to generate heat to melt the sheet solder 27. Thus, the heat mass 17 is brought into junction with the semiconductor device 12. Accordingly, the heat is efficiently conducted to the sheet solder 27. For example, compared with a case where the periphery of the sheet solder 27 is heated by electrical heater unlike induction heating, the high-frequency heating coil 26 of the present embodiment efficiently heats and melts the sheet solder 27 without melting the solder H bringing the semiconductor device 12 into junction with the metal circuit 13.

(9) If an object mounted on the sheet solder 27 weighs light, the surface tension of the melted solder in the case of melting the sheet solder 27 will lift the mounted article up to fail in uniformizing the thickness of the solder H after solidification. However, since the heat mass 17 of the present embodiment functions also as a weight, the heat mass 17 undergoes soldering such that the solder H in the solidified state will provide uniform thickness.

(10) The high-frequency heating coil 26 is equipped in the lid 20. In the case where the lid 20 closes the opening 19a of the box body 19, the high-frequency heating coil 26 is arranged so as to face the heat mass 17. Accordingly, the high-frequency heating coil 26 efficiently heats the heat mass 17 and the high-frequency heating coil 26 is moved to a heating position and a waiting position with a simple configuration. The high-frequency heating coil 26 in a shelter position does not hamper the work of arranging the sheet solder 27 and the heat mass 17 sequentially on the semiconductor device 12 and the high-frequency heating coil 26 in the heating position is appropriate for heating the heat mass 17.

(11) Water is used as the refrigerant for compulsorily cooling the heat sink 15. Since a vehicle generally has a refrigerant circulation path for cooling the engine and the like, in the case where the semiconductor apparatus 10 is equipped in a vehicle, the refrigerant flow path 15a is structured to communicates with the refrigerant circulation path through a pipe. Thereby a pump for refrigerant circulation dedicated for the semiconductor apparatus 10 can be omitted.

Figure 7:
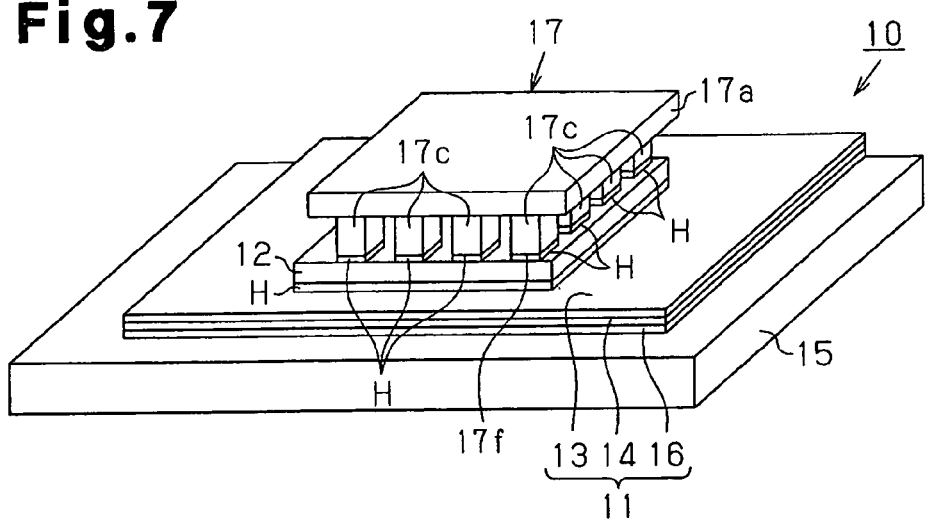
FIG. 7 is a perspective view of a semiconductor apparatus of a second embodiment of the present invention.

FIG. 7 illustrates a second embodiment of the present invention. The second embodiment is different from the first embodiment in the configuration of the heat mass 17. Other configurations are basically the same as the first embodiment, and explanations are omitted.

As illustrated in FIG. 7, the heat mass 17 of the second embodiment comprises a body 17a and a plurality of electrically conductive feet 17c. The body 17a is brought into junction with the semiconductor device 12 with the solder H through the feet 17c. That is, the junction surface of the heat mass 17 brought into direct junction with the semiconductor device 12 with the solder H is divided into distal surfaces 17f of a plurality of the feet 17c, that is, a plurality of small regions. The distal surfaces 17f of a plurality of the feet 17c are separate from one another. According to a heat shock test, in order to restrain an occurrence of a crack in the solder H, the respective distal surfaces 17f preferably measure not more than 2 mm vertically and not more than 2 mm horizontally. The height, that is, the length of each foot 17c is preferably not less than 1.0 mm.

The coefficient of thermal expansion of the heat mass 17 is larger than the coefficient of thermal expansion of the semiconductor device 12. For example, in the case where the heat mass 17 is brought into junction with the semiconductor device 12 with the solder H across the surface opposite to the semiconductor device 12, the semiconductor device 12 generates heat and then the difference between the coefficient of thermal expansion of the heat mass 17 and the coefficient of thermal expansion of the semiconductor device 12 causes an increase in stress acting on the solder H being present between the heat mass 17 and the semiconductor device 12. However, the heat mass 17 of the present embodiment is brought into junction with the semiconductor device 12 with the solder H through the electrically conductive feet 17c. Therefore, the stress acting on the solder H is dispersed to a plurality of the feet 17c and reduced.

The second embodiment has the above described advantages (1) to (3) and (5) to (11) and the following advantages (12) to (13).

(12) The heat mass 17 comprises a plurality of electrically conductive feet 17c and is brought into junction with the semiconductor device 12 with the solder H through the feet 17c. Accordingly, in the case where the semiconductor device 12 generates heat, even if the difference between the heat mass 17 and the semiconductor device 12 in coefficient of thermal expansion causes stress to act on the solder H, the stress is dispersed to a plurality of the feet 17c and reduced.

(13) Since the junction surface of the heat mass 17 brought into junction with the semiconductor device 12 is divided into distal surfaces 17f being respectively present in a plurality of the feet 17c, the thermal stress generated in the heat mass 17 and the semiconductor device 12 respectively is reduced. The respective distal surfaces 17f are set to measure not more than 2 mm longitudinally and not more than 2 mm laterally. The height of the feet 17c is set to not less than 1.0 mm. Therefore, the stress acting on the solder H is reduced further. Consequently, as apparent from the heat shock test, the reliability of the junction part of the solder H with the heat mass 17 and the semiconductor device 12 is improved to restrain an occurrence of a solder crack.

Figure 8A:
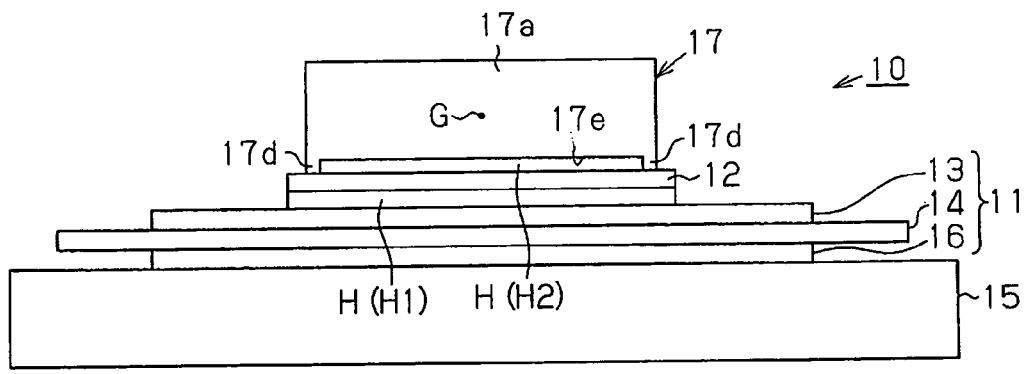
FIG. 8A is a front view of a semiconductor apparatus of a third embodiment of the present invention.
Figure 8B:
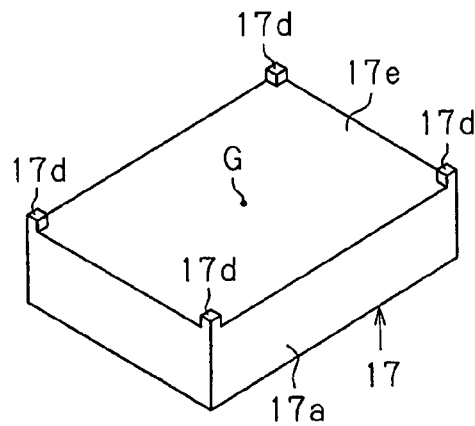
FIG. 8B is a bottom perspective view of the heat mass illustrated in FIG. 8A.

FIGS. 8A and 8B illustrate a third embodiment of the present invention. As illustrated in FIG. 8A, the opposed surface of the body 17a of the third embodiment facing the semiconductor device 12 includes a junction surface 17e with the semiconductor device 12 and four support protrusions 17d in total. The feet 17b of the first embodiment are deleted. The height of the support protrusion 17d, that is, the protruding length of the support protrusion 17d from the junction surface 17e is set to the thickness portion of the solder H being present between the semiconductor device 12 and the junction surface 17e. In other words, the protruding length of the support protrusion 17d from the junction surface 17e is set to be the same as the appropriate thickness of the solder H required for bringing the heat mass 17 into excellent junction with the semiconductor device 12.

As illustrated in FIG. 8B, the body 17a is shaped like a rectangular parallelepiped. The four support protrusions 17d in total are arranged on the four corners of the rectangular junction surface 17e. Accordingly, in the case where the heat mass 17 is mounted on the semiconductor device 12, the center of gravity G of the heat mass 17 is positioned inside an imaginary polygon formed by connecting the four support protrusions 17d. The respective support protrusions 17d are deemed to be support points supporting the heat mass 17 against the semiconductor device 12. Therefore, the imaginary polygon can be said to connect those four support points in total.

Unlike the first embodiment, the work for soldering the heat mass 17 of the present embodiment onto the semiconductor device 12 is carried out concurrently with soldering of the semiconductor device 12 to the insulated circuit substrate 11. Specifically, after positioning the heat sink 15 on the support stand 21 of the soldering apparatus HK illustrated in FIG. 2, the sheet solder 27 and the semiconductor device 12 are sequentially arranged on the metal circuit 13 of the insulated circuit substrate 11. Moreover, the sheet solder 27 and the heat mass 17 are mounted on the semiconductor device 12. The heat mass 17 is mounted such that the support protrusions 17d are positioned on the sheet solder 27.

After closing the box body 19 with the lid 20, the interior of the container 18 is filled with the reducing atmosphere like the first embodiment. Thereafter, the high-frequency current is caused to flow in the high-frequency heating coil 26 to heat the heat mass 17. The heat generated by the heat mass 17 melts the sheet solder 27 being present between the heat mass 17 and the semiconductor device 12 and also heats and melts the sheet solder 27 being present between the semiconductor device 12 and the metal circuit 13 through the semiconductor device 12.

The melted solder of the sheet solder 27 acts on the heat mass 17 so as to lift it with surface tension. However, the heat mass 17 of the present embodiment is set to have weight that the surface tension of the melted solder cannot lift. Therefore, the support protrusions 17d are maintained in the state brought into contact to the upper surface of the semiconductor device 12. When the melted solder is cooled below the melting temperature and gets solidified, the solidified solder H is solidified so as to have a thickness equal to the protruding length of the support protrusion 17d from the junction surface 17e to bring the heat mass 17 into junction with the semiconductor device 12. That is, the solder H comes into junction with the upper surface of the semiconductor device 12 and the junction surface 17e of the heat mass 17.

The third embodiment has the above described advantages (1) to (3) and (5) to (11) and has the following advantages (14) to (16).

(14) The opposed surface of the heat mass 17 facing the semiconductor device 12 has the junction surface 17e brought into junction with the semiconductor device 12 through the solder H and a plurality of support protrusions 17d protruding from the junction surface 17e. The protruding length of the support protrusions 17d from the junction surface 17e is equal to the thickness of the solder H being present between the junction surface 17e and the semiconductor device 12. A plurality of the support protrusions 17d are arranged such that the center of gravity G of the heat mass 17 is positioned inside the imaginary polygon, for example, a quadrangle formed by connecting those protrusions 17d. Therefore, at an occasion of bringing the heat mass 17 into junction with the semiconductor device 12 by soldering at the step of manufacturing the semiconductor apparatus 10, the support protrusions 17d maintain the distance between the junction surface 17e and the semiconductor device 12 constant. Thereby the thickness of the solder H being present between the junction surface 17e and the semiconductor device 12 can be formed to preset thickness. Accordingly, an excellent solder junction part bringing the heat mass 17 into junction with the semiconductor device 12 is formed.

(15) The four support protrusions 17d in total are provided at four corners of the heat mass 17. Accordingly, at the time of manufacturing the semiconductor apparatus 10, the entire junction surface 17e of the heat mass 17 keeps a constant distance relative to the semiconductor device 12 and is brought into junction with the semiconductor device 12 well and easily through the solder H.

(16) In the case of soldering the heat mass 17 to the semiconductor device 12 with the second solder H2 after soldering the semiconductor device 12 to the insulated circuit substrate 11 with the first solder H1, the melting point of the first solder H1 is required to be higher than the melting point of the second solder H2. The reason thereof is that the first solder H1 will be melted at the occasion of soldering the heat mass 17 to the semiconductor device 12 in the case where the melting point of the first solder H1 is lower than the melting point of the second solder H2. However, in the present embodiment, soldering the semiconductor device 12 to the insulated circuit substrate 11 and soldering the heat mass 17 to the semiconductor device 12 are carried out concurrently. Therefore, the same material of the first solder H1 can be used for the second solder H2 to make the solder controllable without complication.

In addition, in the present embodiment, soldering of the semiconductor device 12 to the insulated circuit substrate 11 and soldering of the heat mass 17 to the semiconductor device 12 are carried out in a single step by high-frequency induction heating. Therefore, total time required for soldering is shortened.

The above described respective embodiments may be modified as follows.

In the case of providing the heat mass 17 with a plurality of the feet 17c in order to reduce stress acting on the solder H as in the second embodiment, the thickness of the feet 17c may be increased from the distal surface 17f toward the body 17a as illustrated in FIG. 9A.

The bottom 28 of the heat mass 17 may be formed at a coefficient of thermal expansion lower than the other portions of the heat mass 17 without forming the heat mass 17 of the first embodiment uniformly only with single material as illustrated in FIGS. 9B to 9F. The "bottom 28 of the heat mass 17" means a portion of the heat mass 17 closer to the end part soldered to the semiconductor device 12. The bottom 28 illustrated in FIG. 9B is made of Invar. That is, the bottom 28 is formed of material having a coefficient of thermal expansion which is closer to that of the semiconductor device 12 than that of copper or aluminum. Invar is an alloy containing 36% by weight of Ni (nickel) and substantially all of the remaining percentage of Fe (iron).

The bottom 28 illustrated in FIG. 9C is configured to disperse ceramic in metal such as copper and aluminum with excellent electrical conductivity. The bottom 28 illustrated in FIG. 9D has a ceramic plate with a plurality of holes 28a and metal film 29 bonded to the ceramic plate. The body 17a of the heat mass 17 has combining parts with thin bars entering the holes 28a. Consequently the ceramic plate is combined with the body 17a. That is, the holes 28a are filled with metal configuring the heat mass 17.

The bottom 28 illustrated in FIGS. 9E and 9F contains a metal composite material 30 of copper and Invar. The metal composite material 30 contains expanded metal 31 formed of Invar and copper being matrix metal 32 surrounding the expanded metal 31. The expanded metal 31 is sandwiched by a pair of copper plates. All of them undergo rolling and joining to form the metal composite material 30. Stress acting on the solder H being present between the heat mass 17 comprising the bottom 28 in FIGS. 9B to 9F and the semiconductor device 12 is reduced by a greater degree than in the case of comprising no bottom 28.

The heat mass 17 in FIGS. 9B to 9F may comprise the foot 17b as illustrated in FIG. 1 and may comprise feet 17c as illustrated in FIG. 7. For example, the foot 17b is formed by processing the bottom 28. Alternatively, the coefficient of thermal expansion of the feet 17c is made lower than the coefficient of thermal expansion of the body 17a.

One heat mass 17 may come into junction with a plurality of semiconductor devices 12. In that case, the heat mass 17 comes into electrically conductive connection among those semiconductor devices 12. In particular, as in the case, for example, where a diode is connected to a transistor of an inverter in inverse parallel, in the case where a plurality of semiconductor devices are different from each other in timing of rapid increase in heating, junction of one heat mass 17 to a plurality of semiconductor devices 12 gives rise to an effect equivalent to increase in heat capacity of the heat mass 17.

A plurality of heat masses 17 may be brought into junction with one semiconductor device 12. For example, a large heat mass 17 may be divided into a plurality of small heat masses to reduce the thermal stress further.

A plurality of the support protrusions 17d illustrated in FIGS. 8A and 8B do not necessarily have to be arranged on the four corners of the heat mass 17. As illustrated in FIG. 10A, a pair of linear support protrusions 17d may be formed so as to correspond to a pair of short sides of a rectangular opposed surface to the semiconductor device 12 of the heat mass 17. That is, the pair of the support protrusions 17d is arranged in the both ends of the heat mass 17 in the longitudinal direction.

The protruding length of the support protrusions 17d from the junction surface 17e is preferably equal to thickness of the solder H being present between the junction surface 17e and the semiconductor device 12. For example, the distal surfaces of a plurality of feet 17c can form a set to configure one junction surface 17e. As illustrated in FIG. 10B, the distal surfaces of a great number of feet 17c shaped like rectangular parallelepipeds form a set to configure one junction surface 17e. The four support protrusions 17d in total are provided on the four corners of the junction surface 17e.

In the case of being illustrated in FIG. 10C, the distal surfaces of a plurality of slip-like feet 17c form a set to configure one junction surface 17e. The respective feet 17c extend vertically with respect to the longitudinal direction of the heat mass 17. The four support protrusions 17d in total are arranged on the four corners of the junction surface 17e. In other words, the four support protrusions 17d in total are arranged on the both ends of a pair of feet 17c of the both ends of the heat mass 17 in the longitudinal direction.

The support protrusions 17d in FIGS. 10B and 10C are maintained thickness of the solder H being present between the junction surface 17e and the semiconductor device 12 to a preset value at the occasion of soldering the heat mass 17 to the semiconductor device 12. Therefore, an excellent soldering junction part can be formed.

A plurality of the support protrusions 17d do not necessarily need to be arranged on the four corners of the heat mass 17 as long as a plurality of support protrusions 17d are arranged such that the center of gravity G of the heat mass 17 is positioned inside the imaginary polygon formed by connecting at least three points respectively included in one or a plurality of support protrusions 17d. "The center of gravity G of the heat mass 17 is positioned inside the imaginary polygon formed by connecting at least three points included in one or a plurality of support protrusions 17d" means that the center of gravity G is positioned inside the imaginary triangle formed by connecting three sites, that is, three points, for example, in the case where respective three support protrusions 17d are provided to resemble dots at the three sites. In addition, in the case where four or more support protrusions are provided to resemble dots at four or more sites, the above expression means that the center of gravity G is positioned inside the imaginary polygon formed by connecting at lease three sites thereamong.

Figure 11A:
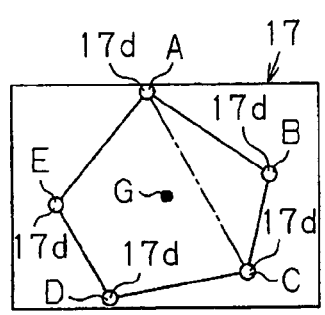
FIGS. 11A to 11C are each a bottom view of a heat mass according to a modified embodiment, illustrating positions of a plurality of supporting protrusions.

For example, the case where five support protrusions 17d are provided in five points of a point A, a point B, a point C, a point D and a point E will be described as illustrated in FIG. 11A. Even in the case where the center of gravity G is positioned outside a triangle formed by connecting the support protrusions 17d in three sites in total of the point A, the point B and the point C, the five support protrusions 17d may be arranged at any positions as long as the center of gravity G is positioned inside a polygon formed by connecting the support protrusion 17d in the five sites in total of the point A, the point B, the point C, the point D and the point E. Alternatively, the five support protrusions 17d may be arranged at any positions as long as the center of gravity G is positioned inside a polygon formed by connecting the support protrusions 17d in four sites in total among the five sites.

Figure 11B:
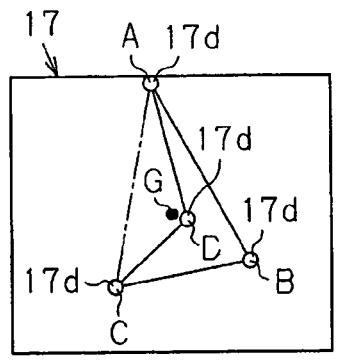

In addition, a case where four support protrusions 17d are provided in four sites to resemble dots as illustrated in FIG. 11B will be described. Even in the case where the center of gravity G is positioned outside a polygon formed by connecting support protrusions 17d in four sites in total of the point A, the point B, the point C and the point D, the three support protrusions 17d may be arranged at any positions as long as the center of gravity G is positioned inside a polygon formed by connecting support protrusions 17d in three sites in total of the point A, the point B and the point C.

Figure 11C:
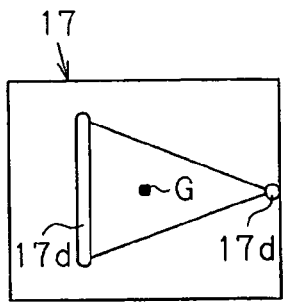

In addition, the case where a linear support protrusion 17d and a dot-like support protrusion 17d are present as illustrated in FIG. 11C or the case where only a pair of linear support protrusions 17d are present as illustrated in FIG. 10A will be described. Those support protrusions 17d are formed in any manner as long as that the center of gravity G is positioned inside an imaginary triangle formed by connecting at least three points included in those support protrusions 17d.

Figure 12A:
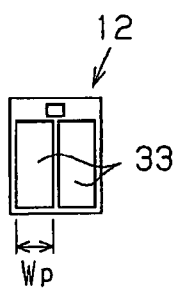
FIGS. 12A to 12C are each a plain view of a semiconductor device according to a modified embodiment.
Figure 12B:
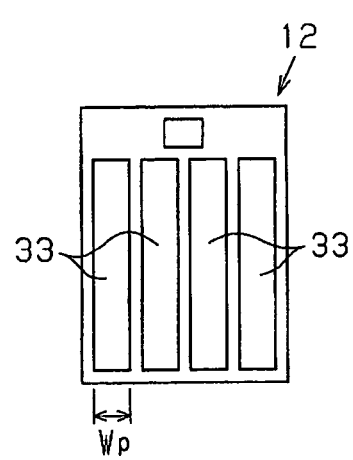
Figure 12C:
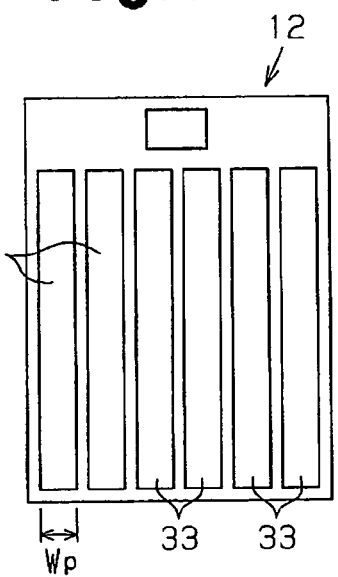
Figure 13A:
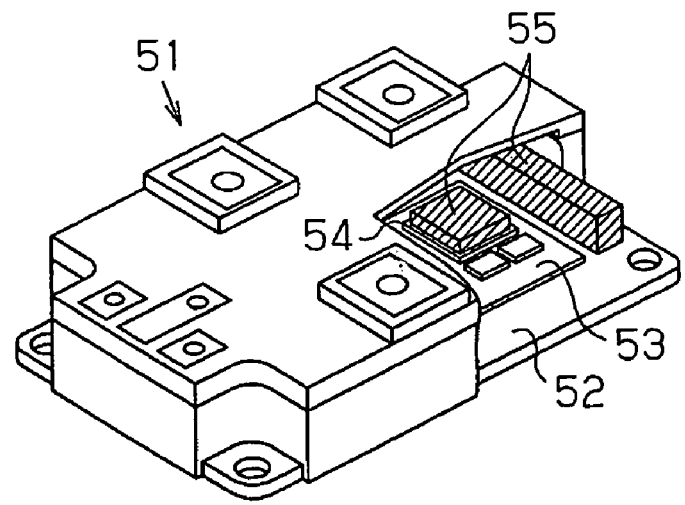
FIG. 13A is a schematic view of a prior art.
Figure 13B:
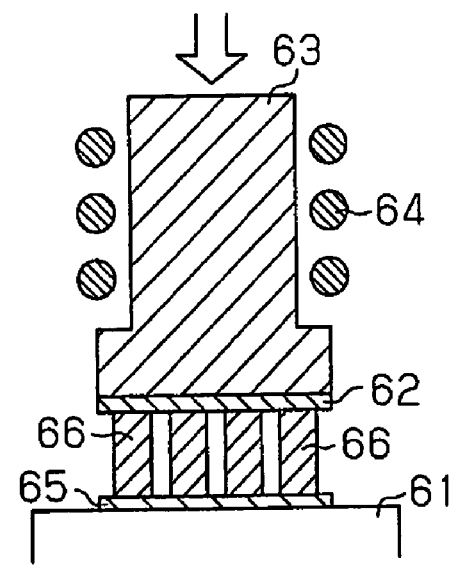
FIG. 13B is a cross-sectional view of another prior art.

As illustrated in FIGS. 12A to 12C, regardless of the chip size of the semiconductor device 12, pads 33 may be laid out such that the width Wp of each pad 33 of the source or the emitter does not exceed an upper limit. In that case, the impedance of the gate pattern can be restrained. For example, the semiconductor device 12 in FIG. 12A is compact with two pads 33 mounted thereon; the semiconductor device 12 in FIG. 12B is middle-sized with four pads 33 mounted thereon; the semiconductor device 12 in FIG. 12C is large-sized with six pads 33 mounted thereon; and the widths Wp of the pads 33 in FIGS. 12A to 12C are the same.

Soldering of the semiconductor device 12 to the insulated circuit substrate 11 and soldering of the heat mass 17 to the semiconductor device 12 in the first embodiment may be carried out concurrently by high-frequency induction heating as in the third embodiment. In addition, like the first embodiment, also in the third embodiment, after soldering of the semiconductor device 12 to the insulated circuit substrate 11, the heat mass 17 may be soldered onto the semiconductor device 12.

In the case where soldering of the semiconductor device 12 to the insulated circuit substrate 11 and soldering of the heat mass 17 to the semiconductor device 12 are carried out in a single step by high-frequency induction heating, the melting temperature of the first solder H1 bringing the semiconductor device 12 into junction with the insulated circuit substrate 11 may be lower than the melting temperature of the second solder H2 bringing the heat mass 17 into junction with the semiconductor device 12. In the case of soldering of the semiconductor device 12 and soldering of the heat mass 17 are carried out in a single step, due to the necessity of causing both of the first solder H1 and the second solder H2 to be melted at a time with the heat mass 17 heated by high-frequency, the melting temperature of the second solder H2 to which heat of the heat mass 17 is easily conducted is preferably higher than the melting temperature of the first solder H1.

The heat sink 15 may be any type as long as it is a cooler of a forced cooling type. The refrigerant flowing in the heat sink 15 is not limited to water but may be another liquid or may be gas such as air. In addition, the heat sink 15 may be a cooler of an ebullient cooling type.

Heat generated in the semiconductor device 12 does not necessarily need to be conducted to the heat sink 15 in an electrically insulated state. For example, in the case where the refrigerant flowing in the heat sink 15 is not an electrically conductive medium but the air, for example, the semiconductor device 12 may be in the state electrically conductible to the heat sink 15. A part of piping for the refrigerant is preferably made of resin, for example, so as to be provided with insulating properties. In addition, the semiconductor device 12 may be directly soldered to the heat sink 15 without interposing the insulated circuit substrate 11.

The heat sink 15, that is, the cooler of a forced cooling type does not necessarily need to be arranged below the semiconductor device 12. The heat sink 15 may be arranged at any position as long as the heat generated in the semiconductor device 12 is conducted to the heat sink 15 through the substrate. The heat sink 15 may be arranged, for example, beside the semiconductor device 12.

A portion of ferromagnetic material may be included inside the heat mass 17 made of copper or aluminum. The heat mass 17 may be provided in its inside with a plate or a bar made of iron or nickel, for example. In this case, the heat mass 17 is heated easily by induction heating.

The number of the metal circuit 13 formed on the insulated circuit substrate 11 is not limited to one but may be more than one. One or a plurality of semiconductor devices 12 may come into junction with a plurality of the metal circuits 13.

The solder used for soldering is not limited to the sheet solder 27, but solder paste may be used. For example, solder paste is applied to the upper surface of the semiconductor device 12, for example, and the heat mass 17 undergoes induction heating with the heat mass 17 arranged on the solder paste.

In the case where the weight of the heat mass 17 is insufficient for preventing the heat mass 17 from being lifted up due to surface tension of the melted solder, a weight may be further mounted on the heat mass 17. Thereafter the heat mass 17 may be soldered to the semiconductor device 12.

The lid 20 may be nonremovable from the box body 19 and may be, for example, openable.

The high-frequency heating coil 26 may be arranged above the lid 20 outside the container 18. In this case, at least the site of the lid 20 opposite to the high-frequency heating coil 26 is preferably formed of electrically insulated material. In addition, the lid 20 in its entirety may be formed of electrically insulated material.

The semiconductor apparatus 10 is not limited to on-vehicle use but may be used for other applications.

What is claimed is:

1. A semiconductor apparatus comprising:
a semiconductor device including a first surface and a second surface;
a cooler of a forced cooling type, the cooler being provided on the first surface and thermally combined with the first surface; and
a heat mass provided on the second surface and thermally combined with the second surface, wherein the heat mass functions also as an electrode of the semiconductor device,
wherein the semiconductor device is disposed between the heat mass and the cooler,
wherein the semiconductor device is provided on an insulated substrate, and
wherein heat generated in the semiconductor device is conducted to the cooler through the insulated substrate,
wherein the heat capacity of the heat mass is set larger than a heat capacity of a heat conduction route from the semiconductor device to the cooler.

2. The semiconductor apparatus according to claim 1, wherein the semiconductor apparatus is for on-vehicle use.

3. The semiconductor apparatus according to claim 1, wherein the electrode is an electrode for a main current of the semiconductor device.

4. The semiconductor apparatus according to claim 1, wherein the heat mass includes a junction surface brought into junction with the semiconductor device with solder, and
wherein the junction surface is divided into a plurality of small regions, the small regions being separate from one another.

5. The semiconductor apparatus according to claim 1, wherein the heat mass has an opposed surface facing the semiconductor device, the opposed surface includes a junction surface coming into junction with the semiconductor device with solder, and the thickness of the solder being present between the junction surface and the semiconductor device is defined as the distance between the junction surface and the semiconductor device,
wherein the opposed surface is provided with a support protrusion protruding from the junction surface by the thickness of the solder, and
wherein the support protrusion includes at least three imaginary points and a center of gravity of the heat mass is set to be positioned inside an imaginary polygon formed by connecting at least three of the imaginary points.

6. The semiconductor apparatus according to claim 5, wherein:
the heat mass defined four corners and the support protrusion is one of a plurality of support protrusions provided to those four corners respectively.

7. The semiconductor apparatus according to claim 1, wherein:
material of the heat mass is metal with a melting point higher than the melting point of the solder bringing the heat mass into junction with the semiconductor device.

8. The semiconductor apparatus according to claim 1, wherein at least a part of the heat mass is ferromagnetic material.

9. A semiconductor apparatus comprising:
a semiconductor device including a first surface and a second surface;
a cooler of a forced cooling type, the cooling being provided on the first surface and thermally combined with the first surface; and
a heat mass provided on the second surface and thermally combined with the second surface, wherein the heat mass functions also as an electrode of the semiconductor device, wherein the semiconductor device is disposed between the heat mass and the cooler, wherein the semiconductor device is provided on an insulated substrate, and wherein heat generated in the semiconductor device is conducted to the cooler through the insulated substrate, wherein a static heating amount from the semiconductor device in a static heating state is defined, and wherein the heat capacity of the heat mass is set such that, in the case where heat larger than the static heating amount is generated from the semiconductor device, the heat mass can absorb a heat that the cooler cannot remove completely.

10. A method for manufacturing the semiconductor apparatus according to claim 1, wherein the semiconductor device is soldered onto a substrate, the method comprising:

mounting the heat mass onto the semiconductor device with solder; and causing the heat mass to undergo high-frequency induction heating, thereby melting the solder by heat generated in the heat mass so as to bring the heat mass into junction with the semiconductor device.

11. The manufacturing method according to claim 10, wherein the soldering of the semiconductor device to the substrate and the soldering of the heat mass to the semiconductor device are carried out in a single step of the high-frequency induction heating.

12. The semiconductor apparatus according to claim 9, wherein the heat mass includes a junction surface brought into junction with the semiconductor device with solder, and wherein the junction surface is divided into a plurality of small regions, the small regions being separate from one another.

13. The semiconductor apparatus according to claim 9, wherein the heat mass has an opposed surface facing the semiconductor device, the opposed surface includes a junction surface coming into junction with the semiconductor device with solder, and the thickness of the solder being present between the junction surface and the semiconductor device is defined as the distance between the junction surface and the semiconductor device, wherein the opposed surface is provided with a support protrusion protruding from the junction surface by the thickness of the solder, and wherein the support protrusion includes at least three imaginary points and a center of gravity of the heat mass is set to be positioned inside an imaginary polygon formed by connecting at least three of the imaginary points.

14. The semiconductor apparatus according to claim 13, wherein:

the heat mass defined four corners and the support protrusion is one of a plurality of support protrusions provided to those four corners respectively.

15. The semiconductor apparatus according to claim 9, wherein:

material of the heat mass is metal with a melting point higher than the melting point of the solder bringing the heat mass into junction with the semiconductor device.

16. The semiconductor apparatus according to claim 9, wherein at least a part of the heat mass is ferromagnetic material.

17. The semiconductor apparatus according to claim 9, wherein the semiconductor apparatus is for on-vehicle use.

18. The semiconductor apparatus according to claim 9, wherein the electrode is an electrode for a main current of the semiconductor device.

* * * * *